(12) United States Patent
Shin et al.

(10) Patent No.: US 11,602,922 B2
(45) Date of Patent: Mar. 14, 2023

(54) COMPOSITE MATERIAL

(71) Applicant: LG CHEM, LTD., Seoul (KR)

(72) Inventors: Jong Min Shin, Daejeon (KR); Dong Woo Yoo, Daejeon (KR); So Jin Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 116 days.

(21) Appl. No.: 16/623,436

(22) PCT Filed: Jul. 6, 2018

(86) PCT No.: PCT/KR2018/007705
§ 371 (c)(1),
(2) Date: Dec. 17, 2019

(87) PCT Pub. No.: WO2019/009670
PCT Pub. Date: Jan. 10, 2019

(65) Prior Publication Data
US 2021/0138768 A1 May 13, 2021

(30) Foreign Application Priority Data

Jul. 6, 2017 (KR) .......................... 10-2017-0086012

(51) Int. Cl.
*B32B 27/06* (2006.01)
*B32B 15/08* (2006.01)
(Continued)

(52) U.S. Cl.
CPC ............ *B32B 27/065* (2013.01); *B32B 15/08* (2013.01); *B32B 27/20* (2013.01);
(Continued)

(58) Field of Classification Search
CPC ....... B32B 27/065; B32B 15/08; B32B 27/20; B32B 2266/045; B32B 2307/202;
(Continued)

(56) References Cited

U.S. PATENT DOCUMENTS 3,707,401 A * 12/1972 Jarema et al. .......... B63B 32/50
428/312.2
2005/0265709 A1 12/2005 Kim et al.
(Continued)

FOREIGN PATENT DOCUMENTS

CN 101600758 A 12/2009
CN 104812512 A 7/2015
(Continued)

OTHER PUBLICATIONS

Translation of KR-100721462-B1, Chang Suk Ky et al., May 23, 2007. (Year: 2007).*
(Continued)

*Primary Examiner* — John D Freeman
(74) *Attorney, Agent, or Firm* — Myers Bigel, P.A.

(57) ABSTRACT

The present application can provide a composite material which comprises a metal foam, a polymer component and an electrically conductive filler, has other excellent physical properties such as impact resistance, processability and insulation properties while having excellent thermal conductivity, and is also capable of controlling electrical conductivity characteristics.

15 Claims, 1 Drawing Sheet

(51) Int. Cl.
  *H01L 23/373*  (2006.01)
  *B32B 27/20*  (2006.01)
(52) U.S. Cl.
  CPC .... *H01L 23/3737* (2013.01); *B32B 2260/046* (2013.01); *B32B 2264/105* (2013.01); *B32B 2264/108* (2013.01); *B32B 2266/045* (2013.01); *B32B 2307/202* (2013.01); *B32B 2307/302* (2013.01); *B32B 2457/00* (2013.01)
(58) Field of Classification Search
  CPC ........ B32B 2307/302; B32B 2260/046; B32B 2264/105; B32B 2264/108; B32B 2457/00; C22C 1/08; B22F 7/02; B22F 7/004; B22F 2007/045; B22F 2301/10; B22F 2007/047; B22F 7/002; Y02E 60/10; H01M 10/653; H01L 23/3736; H01L 23/3737; H01L 23/3733; C08K 3/08; C08K 7/24; C08K 2201/001; H05K 7/20; H05K 7/20481; H05K 7/20472
  See application file for complete search history.

(56) References Cited

U.S. PATENT DOCUMENTS

| | | | |
|---|---|---|---|
| 2008/0213565 | A1 | 9/2008 | Simpson et al. |
| 2011/0148064 | A1 | 6/2011 | Yanase et al. |
| 2012/0008887 | A1 | 1/2012 | Adam |
| 2012/0258293 | A1 | 10/2012 | Adam |
| 2015/0073088 | A1 | 3/2015 | Kim et al. |
| 2015/0223288 | A1 | 8/2015 | Esseghir |
| 2016/0017999 | A1 | 1/2016 | Boyd et al. |

FOREIGN PATENT DOCUMENTS

| | | |
|---|---|---|
| CN | 106098564 A | 11/2016 |
| EP | 2874479 | 8/2018 |
| EP | 3437766 | 2/2019 |
| EP | 3437767 | 2/2019 |
| EP | 3549698 | 10/2019 |
| EP | 3549699 | 10/2019 |
| EP | 3549700 | 10/2019 |
| JP | 2001132756 A | 5/2001 |
| JP | 2003080628 | 3/2003 |
| JP | 2003080629 | 3/2003 |
| JP | 2006040853 | 2/2006 |
| JP | 2006213013 A | 8/2006 |
| JP | 2010052385 A | 3/2010 |
| JP | 2012514171 A | 6/2012 |
| JP | 2013515624 A | 5/2013 |
| JP | 2015532778 | 11/2015 |
| JP | 2016110691 A | 6/2016 |
| KR | 20050113939 A | 12/2005 |
| KR | 1020050113937 | 12/2005 |
| KR | 100721462 B1 * | 5/2007 |
| KR | 1020070079891 | 8/2007 |
| KR | 1020100017043 | 2/2010 |
| KR | 101476744 | 12/2014 |
| KR | 1020150028698 | 3/2015 |
| KR | 1020170113413 | 10/2017 |
| KR | 1020170113414 | 10/2017 |
| KR | 1020180062170 | 6/2018 |
| KR | 1020180062171 | 6/2018 |
| KR | 1020180062172 | 6/2018 |
| KR | 1020190005793 | 1/2019 |

OTHER PUBLICATIONS

Machine translation of JP 2003-080629. (Year: 2003).*
English translation of International Search Report corresponding to International Patent Application No. PCT/KR2018/007705 (2 pages) (dated Oct. 12, 2018).
Extended European Search Report corresponding to European Patent Application No. 18827825.3 (6 pages) (dated Apr. 2, 2020).

* cited by examiner

COMPOSITE MATERIAL

CROSS REFERENCE TO RELATED APPLICATIONS

This application is a 35 U.S.C. § 371 national stage application of PCT International Application No. PCT/KR2018/007705, filed Jul. 6, 2018, which claims priority from Korean Patent Application No. 10-2017-0086012, filed Jul. 6, 2017, the contents of which are incorporated herein in their entireties by reference. The above-referenced PCT International Application was published in the Korean language as International Publication No. WO 2019/009670 A1 on Jan. 10, 2019.

TECHNICAL FIELD

The present application relates to a composite material.

BACKGROUND ART

Heat-dissipating materials can be used in various applications. For example, since batteries and various electronic apparatuses generate heat during operation, a material capable of effectively controlling such heat is required.

As materials having good heat dissipation properties, ceramic materials having good thermal conductivity and the like are known, but since such materials have poor processability, a composite material produced by blending the ceramic filler or the like exhibiting high thermal conductivity in a polymer matrix can be used.

However, since a large amount of filler components must be applied in order to secure high thermal conductivity by the above method, various problems arise. For example, in the case of a material containing a large amount of filler components, the material itself tends to become hard, and in such a case, impact resistance or the like is deteriorated.

DISCLOSURE

Technical Problem

The present application relates to a composite material and in one example, it is intended to provide a composite material ensuring other excellent physical properties such as impact resistance and processability while having excellent thermal conductivity and if necessary, capable of controlling electric conductivity, or a method for producing the same.

Technical Solution

The present application relates to a composite material. The term composite material may mean a material comprising at least a metal foam and a polymer component.

In this specification, the term metal foam or metal skeleton means a porous structure comprising a metal or a metal alloy as a main component. Here, the fact that a metal or the like uses as a main component means that the ratio of the metal or the like is 55 wt % or more, 60 wt % or more, 65 wt % or more, 70 wt % or more, 75 wt % or more, 80 wt % or more, 85 wt % or more, 90 wt % or more, or 95 wt % or more based on the total weight of the metal foam or the metal skeleton. The upper limit of the ratio of the metal or the like contained as the main component is not particularly limited, and for example, may be 100 wt %, 99 wt % or 98 wt % or so.

In this specification, the term porous property may mean a case where porosity is at least 10% or more, 20% or more, 30% or more, 40% or more, 50% or more, 60% or more, 70% or more, 75% or more, or 80% or more. The upper limit of the porosity is not particularly limited, and may be, for example, less than about 100%, about 99% or less, or about 98% or less or so. The porosity can be calculated in a known manner by calculating the density of the metal foam or the like.

The composite material has high thermal conductivity, and accordingly, it can be used as a material for controlling heat, such as a heat-dissipating material.

For example, the composite may have thermal conductivity of about 0.4 W/mK or more, 0.45 W/mK or more, 0.5 W/mK or more, 0.55 W/mK or more, 0.6 W/mK or more, 0.65 W/mK or more, 0.7 W/mK or more, 0.75 W/mK or more, 0.8 W/mK or more, 0.85 W/mK or more, 0.9 W/mK or more, 0.95 W/mK or more, 1 W/mK or more, 1.5 W/mK or more, 2 W/mK or more, 2.5 W/mK or more, 3 W/mK or more, 3.5 W/mK or more, 4 W/mK or more, 4.5 W/mK or more, 5 W/mK or more. The higher the thermal conductivity of the composite material, the composite material may have more excellent thermal control functions, which is not particularly limited, and in one example, it may be about 100 W/mk or less, 90 W/mK or less, 80 W/mK or less, 70 W/mK or less, 60 W/mK or less, 50 W/mK or less, 40 W/mK or less, 30 W/mK or less, 20 W/mK or less, 15 W/mK or less, 10 W/mk or less, 8 W/rnk or less, or 6 W/mK or less or so. The thermal conductivity of the composite material referred to in this specification is measured according to the description method of Examples to described below.

Among physical properties mentioned in this specification, when the measured temperature affects relevant physical properties, the physical properties are physical properties measured at room temperature, unless otherwise specified. The term room temperature is a natural temperature without being heated or cooled, which may be, for example, any temperature in a range of 10° C. to 30° C., or a temperature of about 23° C. or about 25° C. or so.

While the composite material of the present application has excellent heat conduction properties as above, other properties such as processability and impact resistance can be stably secured, and such effects can be achieved by the contents described in this specification.

The shape of the metal foam contained in the composite material is not particularly limited, but may be a film shape in one example. In the composite material of the present application, a polymer component existing at least on the surface or in the interior of the metal foam in the film form is added. FIG. 1 is a diagram showing a composite material according to one example of the present application. As in the drawing, the composite material (20) of the present application may comprise a metal foam (22), and may also comprise a polymer component (21) therein and/or on its surfaces. Here, the drawing has shown the case where the polymer component (21) is present both the interior and the surface, but the polymer component (21) may also be present only on any one of the interior or the surface of the metal foam (22), and even if it is present in the interior of the metal foam (22), it may also be filled in only a part of the metal foam (22), not all the interior thereof.

That is, the polymer component may form a surface layer on at least one surface of the metal foam, or may be filled and present in the voids inside the metal foam, and in some cases, it may also be filled into the metal foam while forming the surface layer. In the case of forming a surface layer, the polymer component may form the surface layer on at least one surface, some surfaces, or all surfaces among surfaces of the metal foam. In one example, the polymer component may form the surface layer on at least the upper and/or lower surfaces, which are the main surfaces of the metal foam. The surface layer may be formed to cover the entire surface of the metal foam, or may also be formed to cover only a part of the surface.

The metal foam in the composite material may have porosity in a range of about 10% to 99%. The metal foam having this porosity has a porous metal framework forming a suitable heat transfer network, and thus it can ensure excellent thermal conductivity even if a small amount of the relevant metal foam is applied. In another example, the porosity may be 15% or more, 20% or more, 25% or more, 30% or more, 35% or more, 40% or more, 45% or more, 50% or more, or 70% or more, or may be 98% or less, 95% or less, 90% or less, 85% or less, or 80% or less.

The metal foam may be in the form of a film. In this case, the thickness of the film can be adjusted in consideration of the desired thermal conductivity or thickness ratio, and the like, in manufacturing a composite material according to a method to be described below. In order to ensure the target thermal conductivity, the thickness of the film may be, for example, about 10 µm or more, about 20 µm or more, about 30 µm or more, about 40 µm or more, about 45 µm or more, about 50 µm or more, about 55 µm or more, about 60 µm or more, about 65 µm or more, about 70 µm or more, about 100 µm or more, about 150 µm or more, about 200 µm or more, about 250 µm or more, about 300 µm or more, about 350 µm or more, about 400 µm or more, about 450 µm or more, or about 500 µm or more. The upper limit of the thickness of the film is controlled according to the purpose, which is not particularly limited, but may be, for example, 10 mm or less, 5,000 µm or less, 2,000 µm or less, 1,500 µm or less, about 1,000 µm or less, about 900 µm or less, about 900 µm or less, about 800 µm or less, about 700 µm or less, about 600 µm or less, about 500 µm or less, about 400 µm or less, about 300 µm or less, about 200 µm or less, about 150 µm or less, about 100 µm or less, about 90 µm or less, about 80 µm or less, about 70 µm or less, about 60 µm or less, or about 55 µm or less or so.

In this specification, when the thickness of the relevant target is not constant, the thickness may be a minimum thickness, a maximum thickness or an average thickness of the target.

The metal foam may be a material having high thermal conductivity. In one example, the metal foam may comprise or consist of a metal or a metal alloy having thermal conductivity of about 8 W/mK or more, about 10 W/mK or more, about 15 W/mK or more, about 20 W/mK or more, about 25 W/mK or more, about 25 W/mK or more, about 30 W/mK or more, about 35 W/mK or more, about 40 W/mK or more, about 45 W/mK or more, about 50 W/mK or more, about 60 W/mK or more, about 70 W/mK or more, about 75 W/mK or more, about 80 W/mK or more, about 85 W/mK or more, or about 90 W/mK or more. The thermal conductivity is not particularly limited, which may be, for example, about 1,000 W/mk or less or so, because the higher the numerical value, the desired thermal control characteristics can be ensured while applying a small amount of the metal foam.

The skeleton of the metal foam may be composed of various kinds of metals or metal alloys, where a material capable of exhibiting thermal conductivity in the above-mentioned range may be selected from these metals or metal alloys. Such a material can be exemplified by any metal selected from the group consisting of copper, gold, platinum, silver, aluminum, nickel, manganese, iron, cobalt, magnesium, molybdenum, tungsten and zinc, or an alloy of two or more thereof, and the like, but is not limited thereto.

Such metal foams are variously known, and also various methods for preparing metal foams are variously known. In the present application, such known metal foams or metal foams prepared by the known methods can be applied.

As a method for preparing a metal foam, a method of sintering a pore-forming agent such as a salt and a composite material of a metal, a method of coating a metal on a support such as a polymer foam and sintering it in this state or a slurry method, and the like is known. Furthermore, the metal foam can also be prepared by a method disclosed in Korean Patent Application No. 2017-0086014, 2017-0040971, 2017-0040972, 2016-0162154, 2016-0162153 or 2016-0162152, and the like, which is a prior application of the present applicant.

The metal foam may also be prepared by the induction heating method from the methods described in the prior applications, where the metal foam may comprise at least a conductive magnetic metal. In this case, the metal foam may comprise 30 wt % or more, 35 wt % or more, 40 wt % or more, 45 wt % or more, or 50 wt % or more of the conductive magnetic metal on the basis of weight. In another example, the ratio of the conductive magnetic metal in the metal foam may be about 55 wt % or more, 60 wt % or more, 65 wt % or more, 70 wt % or more, 75 wt % or more, 80 wt % or more, 85 wt % or more, or 90 wt % or more. The upper limit of the ratio of the conductive magnetic metal is not particularly limited, and may be, for example, less than about 100 wt % or 95 wt % or less.

In the present application, the term conductive magnetic metal is a metal having predetermined relative magnetic permeability and conductivity, which may mean a metal capable of generating heat to such an extent that the metal can be sintered by the induction heating method.

In one example, as the conductive metal, a metal having relative magnetic permeability of 90 or more may be used. The relative magnetic permeability ($\mu_r$) is a ratio ($\mu/\mu_0$) of the magnetic permeability ($\mu$) of the relevant material to the magnetic permeability ($\mu_0$) in the vacuum. In another example, the relative magnetic permeability may be 95 or more, 100 or more, 110 or more, 120 or more, 130 or more, 140 or more, 150 or more, 160 or more, 170 or more, 180 or more, 190 or more, 200 or more, 210 or more, 220 or more, 230 or more, 240 or more, 250 or more, 260 or more, 270 or more, 280 or more, 290 or more, 300 or more, 310 or more, 320 or more, 330 or more, 340 or more, 350 or more, 360 or more, 370 or more, 380 or more, 390 or more, 400 or more, 410 or more, 420 or more, 430 or more, 440 or more, 450 or more, 460 or more, 470 or more, 480 or more, 490 or more, 500 or more, 510 or more, 520 or more, 530 or more, 540 or more, 550 or more, 560 or more, 570 or more, 580 or more, or 590 or more. The higher the relative magnetic permeability is, the higher the heat is generated at the time of application of the electromagnetic field for induction heating which is described below, whereby the upper limit is not particularly limited. In one example, the upper limit of the relative magnetic permeability may be, for example, about 300,000 or less.

The conductive magnetic metal may have conductivity at 20° C. of about 8 MS/m or more, 9 MS/m or more, 10 MS/m or more, 11 MS/m or more, 12 MS/m or more, 13 MS/m or more, or 14.5 MS/m or more. The upper limit of the conductivity is not particularly limited, and for example, the conductivity may be about 30 MS/m or less, 25 MS/m or less, or 20 MS/m or less.

A specific example of such a conductive magnetic metal includes nickel, iron or cobalt, and the like, but is not limited thereto.

The composite material further comprises a polymer component present on the surface of the metal foam or in the interior of the metal foam, as described above, wherein the ratio (T/MT) of the total thickness (T) of such a composite material to the thickness (MT) of the metal foam may be 3 or less, or 2.5 or less. In another example, the thickness ratio may be about 2 or less, 1.5 or less, 1.4 or less, 1.3 or less, 1.2 or less, 1.15 or less, or 1.1 or less. The lower limit of the thickness ratio is not particularly limited, but in one example, it may be about 1 or more, about 1.01 or more, about 1.02 or more, about 1.03 or more, about 1.04 or more, about 1.05 or more, or about 1.1 or more. Under such a thickness ratio, it is possible to provide a composite material having excellent processability or impact resistance, and the like, while ensuring the desired thermal conductivity.

The kind of the polymer component included in the composite material of the present application is not particularly limited, which may be selected in consideration of, for example, processability, impact resistance, insulation properties or the like of the composite material. An example of the polymer component applicable in the present application may include one or more selected from the group consisting of known acrylic resins, silicone resins, epoxy resins, urethane resins, amino resins, various rubber resins, and phenol resins, but is not limited thereto. In one example, silicone resins such as polydimethylsiloxane series may be applied as the polymer component.

The composite material of the present application can secure excellent thermal conductivity while minimizing the ratio of components securing the thermal conductivity mainly through the application of the above-described metal foam, thereby securing the desired physical properties without damaging processability or impact resistance, and the like.

In one example, the ratio (MV/PV) of the volume (PV) of the polymer component and the volume (MV) of the metal foam contained in the composite material may be 10 or less. In another example, the ratio (MW/PV) may be 9 or less, 8 or less, 7 or less, 6 or less, 5 or less, 4 or less, 3 or less, 2 or less, 1 or less, or 0.5 or less or so. The lower limit of the volume ratio is not particularly limited, which may be, for example, about 0.1 or so. The volume ratio can be calculated through the weight of the polymer component and the metal foam, included in the composite material, and the density of the relevant components.

In another example, the content of the metal foam in the composite material may be about 3 wt % or more, about 5 wt % or more, or about 10 wt % or more, relative to the weight of the entire composite material. In addition, the content of the metal foam filler may be, for example, about 50 wt % or less, about 40 wt % or less, or about 25 wt % or less or so, relative to the weight of the entire composite material.

In the composite material of the present application, the polymer component as above may form a surface layer on at least one surface of the metal foam.

In this case, the thickness of the surface layer (polymer skin layer) is controlled according to the purpose, which is not particularly limited, but may be, for example, about 300 μm or less, 250 μm or less, 200 μm or less, or 150 μm or less, about 100 μm or less, about 80 μm or less, about 60 μm or less, about 40 μm or less, about 30 μm or less, about 25 μm or less, about 20 μm or less, about 15 μm or less, about 10 μm or less, or about 5 μm or less or so. The thickness of the skin layer may be, for example, 5 μm or more, 10 μm or more, 15 μm or more, 20 μm or more, 25 μm or more, 30 μm or more, 70 μm or more, or 100 μm or more or so.

The polymer component may further comprise an electrically conductive filler, and for example, the electrically conductive filler may be contained in the polymer component filling the internal voids of the metal foam and/or the surface layer. Through this, a composite material having better heat conduction characteristics can be provided, and the electrical conductivity of the composite material can also be controlled. FIG. 2 is an example of the case where the electrically conductive filler is present in the surface layer. As in FIG. 2, the composite material (30) of the present application may comprise a polymer component (31), a metal foam (32) and an electrically conductive filler (35).

In the present application, the term electrically conductive filler may mean particles having conductivity at 20° C. of about 8 MS/m or more, 9 MS/m or more, 10 MS/m or more, 11 MS/m or more, 12 MS/m or more, 13 MS/m or more, or 14.5 MS/m or more. The upper limit of the conductivity is not particularly limited, which may be, for example, about 30 MS/m or less, 25 MS/m or less, or 20 MS/m or less.

The specific kind of the electrically conductive filler applicable in the present application is not particularly limited as long as it has the above-mentioned conductivity, and known metal fillers, metal alloy fillers or carbon-based fillers, and the like can be used.

An example of the filler can be exemplified by a filler of an electrically conductive metal such as nickel, iron, cobalt, silver, copper, gold, aluminum, calcium, tungsten, zinc, molybdenum, platinum, gold, lithium, iron, platinum, tin, lead, titanium, manganese or chromium, or a filler of an alloy of two or more thereof, or a filler such as graphite, carbon fiber, carbon nanotube, graphene or graphite, but is not limited thereto.

The shape or ratio of the filler is not particularly limited. In one example, the shape of the filler may have various shapes such as a substantially spherical shape, a needle shape, a plate shape, a flake shape, a dendritic shape or a star shape, but is not particularly limited to the shape.

In one example, the electrically conductive filler may have an average particle diameter in a range of 0.001 μm to 80 μm. In another example, the average particle diameter of the filler may be 0.01 μm or more, 0.1 μm or more, 0.5 μm or more, 1 μm or more, 2 μm or more, 3 μm or more, 4 μm or more, 5 μm or more or about 6 μm or more. In another example, the average particle diameter of the filler may be about 75 μm or less, about 70 μm or less, about 65 μm or less, about 60 μm or less, about 55 μm or less, about 50 μm or less, about 45 μm or less, about 40 μm or less, about 35 μm or less, about 30 μm or less, about 25 μm or less, about 20 μm or less, about 15 μm or less, about 10 μm or less, or about 5 μm or less.

The ratio of the filler can be adjusted within the range in which the desired properties are secured or undamaged. In one example, the filler may be included in the composite material in a volume ratio of about 80 vol % or less. Here, the volume ratio is a value calculated based on the weight and density of each of the components constituting the composite material, for example, the metal foam, the polymer component and the filler.

In another example, the volume ratio may be about 75 vol % or less, 70 vol % or less, 65 vol % or less, 60 vol % or less, 55 vol % or less, 50 vol % or less, 45 vol % or less, 40 vol % or less, 35 vol % or less, or about 30 vol % or less or so, or may be about 1 vol % or more, 2 vol % or more, 3 vol % or more, 4 vol % or more, or about 5 vol % or more or so.

In another example, the filler may be included in the composite material in a ratio of about 0.1 to 50 parts by weight relative to 100 parts by weight of the polymer component. In another example, the ratio may be about 0.5 parts by weight or more, 1 part by weight or more, 5 parts by weight or more, or 10 parts by weight or more, and may also be about 45 parts by weight or less, 40 parts by weight or less, 35 parts by weight or less, 30 parts by weight or less, 25 parts by weight or less, 20 parts by weight or less, or 15 parts by weight or less or so.

The present application also relates to a method for preparing a composite material in the form as above. The method may comprise a step of curing a curable polymer composition comprising an electrically conductive filler in a state where the polymer composition is present on the surface of a metal foam comprising a metal or a metal alloy having thermal conductivity of 8 W/mk or more and being in the form of a film.

The details of the metal foam or filler applied in the method are as described above, and specific matters of the composite material to be prepared may also follow the contents as described above.

On the other hand, the polymer composition applied in the above is not particularly limited as long as it can form the above-mentioned polymer component through curing or the like, and such polymer components are variously known in the art.

That is, for example, the composite material can be prepared by performing the curing through a known method using a material having appropriate viscosity among known components.

Advantageous Effects

The present application can provide a composite material which comprises a metal foam, a polymer component and an electrically conductive filler, has other excellent physical properties such as impact resistance, processability and insulation properties while having excellent thermal conductivity, and is also capable of controlling electrical conductivity characteristics.

MODE FOR INVENTION

Figure 1:
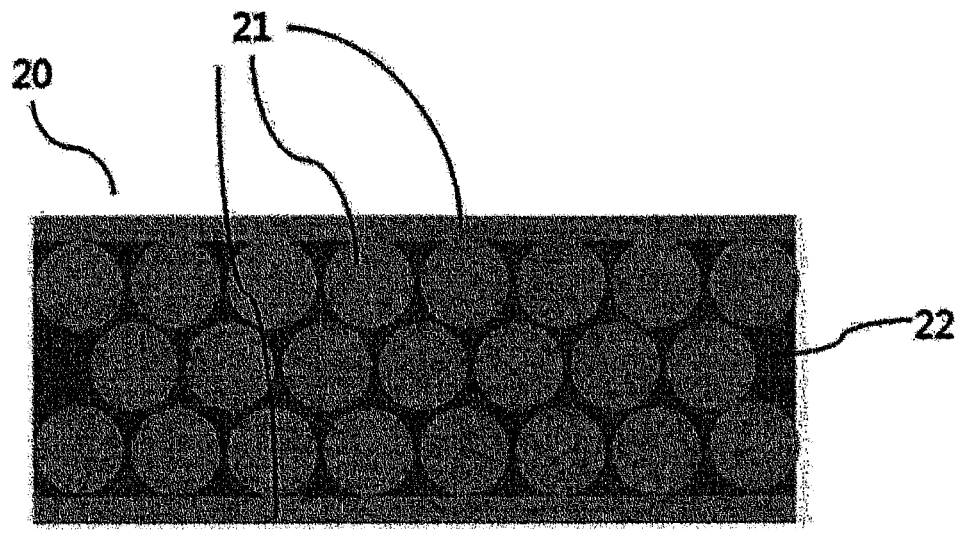
FIGS. 1 and 2 are schematic diagrams of exemplary composites of the present application.
Figure 2:
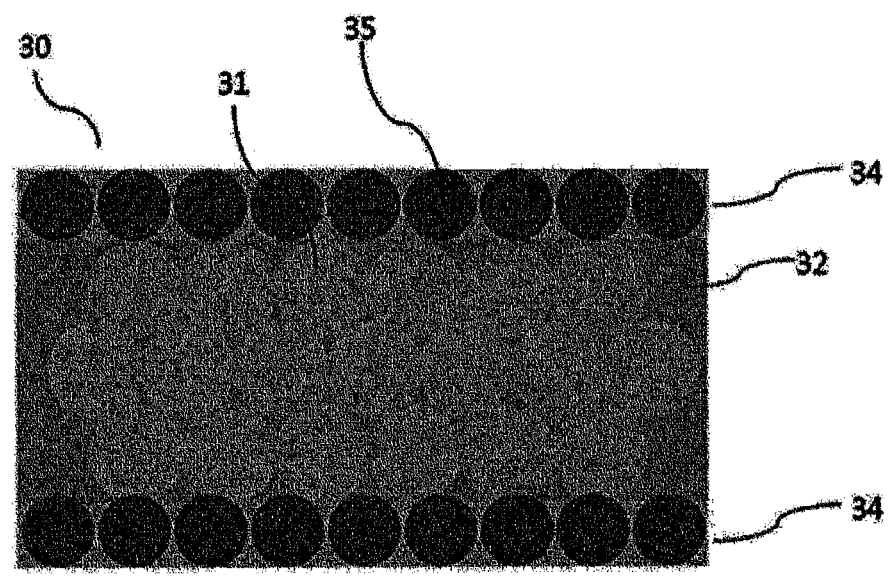

Hereinafter, the present application will be described in detail by way of examples and comparative examples, but the scope of the present application is not limited to the following examples.

Example 1

The metal foam was a copper metal foam, where the copper foam in a film shape with a thickness of about 100 μm or so and porosity of about 70% or so was used. The copper metal foam was impregnated with a solution (copper powder 10 wt %) in which copper powder with an average particle diameter of 4 μm or so while being in a dendritic shape was mixed with a thermosetting silicone resin (Dow Corning Co., Sylgard 183kit polydimethylsiloxane), and an excess of composition was removed using an applicator so that the final composite material was in a film form having a thickness of about 120 μm or so. Subsequently, the material was maintained in an oven at about 120° C. for about 20 minutes and cured to prepare a composite material. The thermal conductivity of this composite material was about 2.765 W/mK or so and the electric resistance was about 0.36 Ω/□ or so.

The thermal conductivity was determined by obtaining the thermal diffusivity (A), specific heat (B) and density (C) of the composite material and substituting them into an equation of thermal conductivity=ABC, where the thermal diffusivity was measured with a laser flash method (LFA equipment, model name: LFA467), the specific heat was measured by way of DSC (differential scanning calorimeter) equipment and the density was measured with Archimedes method. Also, the thermal conductivity is a value with respect to the thickness direction (Z axis) of the composite material. In addition, the electric resistance was measured with a sheet resistance meter of a 4-point probe system.

Example 2

A composite material was prepared in the same manner as in Example 1, except that copper powder with an average particle diameter of about 10 μm or so while being in a flake shape was applied as the electrically conductive filler. The thermal conductivity of this composite material was about 4.329 W/mK or so and the electric resistance was 0.32 Ω/□ or so.

Example 3

A composite material was prepared in the same manner as in Example 1, except that nickel powder with an average particle diameter in a level of about 3 to 6 μm or so while being in a spherical shape was applied as the electrically conductive filler. The thermal conductivity of this composite material was about 1.741 W/mK or so and the electric resistance was 0.048 Ω/□ or so.

Example 4 composite material was prepared in the same manner as in Example 1, except that nickel powder with an average particle diameter in a level of about 3 to 6 μm or so while being in a flake shape was applied as the electrically conductive filler. The thermal conductivity of this composite material was about 2.986 W/mK or so and the electric resistance was 0.041 Ω/□ or so.

Example 5

A composite material was prepared in the same manner as in Example 1, except that graphite powder with an average particle diameter of about 3 to 6 μm or so while being in a flake shape was applied as the electrically conductive filler. The thermal conductivity of this composite material was about 2.134 W/mK or so and the electric resistance was about 0.51 Ω/□ or so.

Comparative Example 1

A thermosetting silicone resin (Dow Corning Co., Sylgard 183kit polydimethylsiloxane) was formed into a 120 μm thick film using a film applicator. Thereafter, thermal curing proceeded by heating it in an oven at 120° C. for 20 minutes.

The thermal conductivity of this composite material was about 0.270 W/mK or so and the electrical resistance was measured as high as an insulation level.

Comparative Example 2

A thermosetting silicone resin (Dow Corning Co., Sylgard 183kit polydimethylsiloxane) was coated on a sheet type copper foam having a thickness of 100 μm and porosity of 75% using a film applicator to have the entire thickness of 120 μm. Thereafter, thermal curing proceeded by heating it in an oven at 120° C. for 20 minutes to prepare a composite material. The thermal conductivity of this composite material was about 1.212 W/mK or so and the electrical resistance was measured as high as an insulation level.

Comparative Example 3

A solution prepared by mixing a thermosetting silicone resin (Dow Corning Co., Sylgard 183kit polydimethylsiloxane) and a mixed solution (copper powder: 25 wt %) of copper powder being in a dendritic shape and having an average particle diameter of 4 μm was formed into a 120 μm thick film using a film applicator. Thereafter, thermal curing proceeded by heating it in an oven at 120° C. for 20 minutes to prepare a heat-dissipating composite material. The thermal conductivity of this composite material was about 0.402 W/mK or so and the electrical resistance was measured as high as an insulation level.

Comparative Example 4

A solution prepared by mixing a thermosetting silicone resin (Dow Corning Co., Sylgard 183kit polydimethylsiloxane) and a mixed solution (copper powder: 25 wt %) of copper powder being in a flake shape and having an average particle diameter of about 10 μm was formed into a 120 μm thick film using a film applicator. Thereafter, thermal curing proceeded by heating it in an oven at 120° C. for 20 minutes to prepare a heat-dissipating composite material. The thermal conductivity of this composite material was about 0.338 W/mK or so and the electrical resistance was measured as high as an insulation level.

Comparative Example 5

A solution prepared by mixing a thermosetting silicone resin (Dow Corning Co., Sylgard 183kit polydimethylsiloxane) and a mixed solution (nickel powder: 25 wt %) of nickel powder being in a spherical shape and having an average particle diameter of 3 to 6 μm or so was formed into a 120 μm thick film using a film applicator. Thereafter, thermal curing proceeded by heating it in an oven at 120° C. for 20 minutes to prepare a heat-dissipating composite material. The thermal conductivity of this composite material was about 0.297 W/mK or so and the electrical resistance was measured as high as an insulation level.

Comparative Example 6

A solution prepared by mixing a thermosetting silicone resin (Dow Corning Co., Sylgard 183kit polydimethylsiloxane) and a mixed solution (nickel powder: 25 wt %) of nickel powder being in a flake shape and having an average particle diameter of 3 to 6 μm or so was formed into a 120 μm thick film using a film applicator. Thereafter, thermal curing proceeded by heating it in an oven at 120° C. for 20 minutes to prepare a heat-dissipating composite material. The thermal conductivity of this composite material was about 0.301 W/mK or so and the electrical resistance was measured as high as an insulation level.

What is claimed is:

1. A composite material, comprising:
   a metal foam in the form of a film; and
   a polymer component comprising an electrically conductive filler that is present on a surface of the metal foam and in an interior portion of the metal foam,
   wherein the metal foam has a thickness of 500 μm or less,
   wherein the composite material has a total thickness (T) and the metal foam has a thickness (MT) and a ratio of T/MT is in a range of 1.1 to 3,
   wherein the polymer component forms a surface layer on the surface of the metal foam,
   wherein a thickness of the surface layer is from 5 μm to 40 μm,
   wherein the surface layer comprises the electrically conductive filler,
   wherein the electrically conductive filler comprises a filler having a needle shape, a plate shape, a flake shape, a dendritic shape, and/or a star shape,
   wherein a porosity of the metal foam is from 10% to 85%,
   wherein the polymer component comprises one or more resins selected from the group consisting of an acrylic resin, a silicone resin, an epoxy resin, an amino resin, and a phenol resin, and
   wherein an amount of the electrically conductive filler is 20 parts by weight or less relative to 100 parts by weight of the polymer component.

2. The composite material according to claim 1, wherein the metal foam comprises a metal or a metal alloy having a thermal conductivity of 8 W/mK or more.

3. The composite material according to claim 1, wherein the metal foam has a thickness in a range of 10 μm to 500 μm.

4. The composite material according to claim 1, wherein the metal foam has a porosity in a range of 15 to 80%.

5. The composite material according to claim 1, wherein the metal foam has a metal skeleton comprising a metal selected from the group consisting of copper, gold, platinum, silver, aluminum, nickel, manganese, iron, cobalt, magnesium, molybdenum, tungsten and zinc, and combinations thereof.

6. The composite material according to claim 1, wherein the polymer component has a volume (PV) and the metal foam has a volume (MV), and a ratio of MV/PV is 10 or less.

7. The composite material according to claim 1, wherein the electrically conductive filler is a metal filler, a metal alloy filler or a carbon-based filler.

8. The composite material according to claim 1, wherein the electrically conductive filler is one or more fillers selected from the group consisting of nickel, iron, cobalt, silver, copper, gold, aluminum, calcium, tungsten, zinc, molybdenum, platinum, gold, lithium, iron, platinum, tin, lead, titanium, manganese, magnesium and chromium.

9. The composite material according to claim 1, wherein the electrically conductive filler is graphite, carbon fiber, carbon nanotube, or graphene.

10. The composite material according to claim 1, wherein the electrically conductive filler has an average particle diameter in a range of 0.001 μm to 80 μm.

11. The composite material according to claim 1, wherein a volume ratio of the electrically conductive filler in the composite material is 80 vol % or less.

12. A method for preparing the composite material of claim 1, the method comprising:
   curing a curable polymer composition comprising the electrically conductive filler in a state where the curable polymer composition is present on the surface of the metal foam, wherein the metal foam comprises a metal or a metal alloy.

13. The composite material according to claim 1, wherein the metal foam comprises copper.

14. The composite material according to claim 1, wherein the composite material has a thermal conductivity of at least about 1.5 W/mK.

15. The composite material according to claim 1, wherein the composite material has a sheet resistance of about 0.36 Ω/sq, about 0.32 Ω/sq, about 0.048 Ω/sq, about 0.041 Ω/sq, or about 0.51 Ω/sq.

\* \* \* \* \*